(12) United States Patent
Maeda et al.

(10) Patent No.: US 8,797,750 B2
(45) Date of Patent: Aug. 5, 2014

(54) METAL SHEET STRUCTURE AND ELECTRONIC DEVICE

(75) Inventors: Hideki Maeda, Kawasaki (JP); Akira Shimasaki, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 345 days.

(21) Appl. No.: 13/445,456

(22) Filed: Apr. 12, 2012

(65) Prior Publication Data
US 2012/0195012 A1 Aug. 2, 2012

Related U.S. Application Data

(63) Continuation of application No. PCT/JP2009/067934, filed on Oct. 16, 2009.

(51) Int. Cl.
| | | |
|---|---|---|
| *H05K 5/00* | (2006.01) | |
| *H05K 9/00* | (2006.01) | |
| *H05K 7/18* | (2006.01) | |
| *H05K 5/02* | (2006.01) | |
| *H05K 7/14* | (2006.01) | |
| *G06F 1/18* | (2006.01) | |

(52) U.S. Cl.
CPC ............... *H05K 7/18* (2013.01); *H05K 5/0247* (2013.01); *H05K 9/0022* (2013.01); *H05K 7/1488* (2013.01); *G06F 1/181* (2013.01)
USPC ........... 361/752; 361/818; 361/800; 361/816; 174/377; 174/384; 174/372

(58) Field of Classification Search
USPC .................. 428/457; 174/377, 384, 372, 259; 361/716, 752, 818, 816, 800, 788; 108/161; 211/41.1; 228/173.6; 248/636, 638
See application file for complete search history.

(56) References Cited

U.S. PATENT DOCUMENTS

| | | | | |
|---|---|---|---|---|
| 5,023,754 A | * | 6/1991 | Aug et al. | 361/800 |
| 5,266,053 A | * | 11/1993 | Jamet et al. | 439/607.36 |
| 6,222,124 B1 | * | 4/2001 | Pritchard et al. | 174/66 |
| 6,643,141 B2 | * | 11/2003 | Kaetsu et al. | 361/797 |
| 7,369,416 B2 | * | 5/2008 | Plabst | 361/818 |
| 2002/0106935 A1 | * | 8/2002 | Udd | 439/540.1 |

FOREIGN PATENT DOCUMENTS

| | | |
|---|---|---|
| JP | 51-25784 | 2/1976 |
| JP | 59-37000 | 2/1984 |
| JP | 2000-223213 | 8/2000 |

OTHER PUBLICATIONS

International Search Report for PCT/JP2009/067934 mailed Dec. 8, 2009.
Extended European Search Report mailed Mar. 6, 2013 for corresponding European Application No. 09850409.5.

* cited by examiner

*Primary Examiner* — Robert J Hoffberg
*Assistant Examiner* — Michael Matey
(74) *Attorney, Agent, or Firm* — Staas & Halsey LLP

(57) ABSTRACT

A first metal sheet and a second metal sheet are arranged opposite a printed circuit board including a second connector that fits into a first connector that is arranged at one end of a cable. A hole section through which the first connector passes is arranged in each of the first metal sheet and the second metal sheet. The first connector fits into the second connector by passing through each of the hole sections of the first metal sheet and the second metal sheet. The first metal sheet and the second metal sheet support a connector case of the first connector, thus improving the load bearing characteristics of the cable connection.

14 Claims, 12 Drawing Sheets

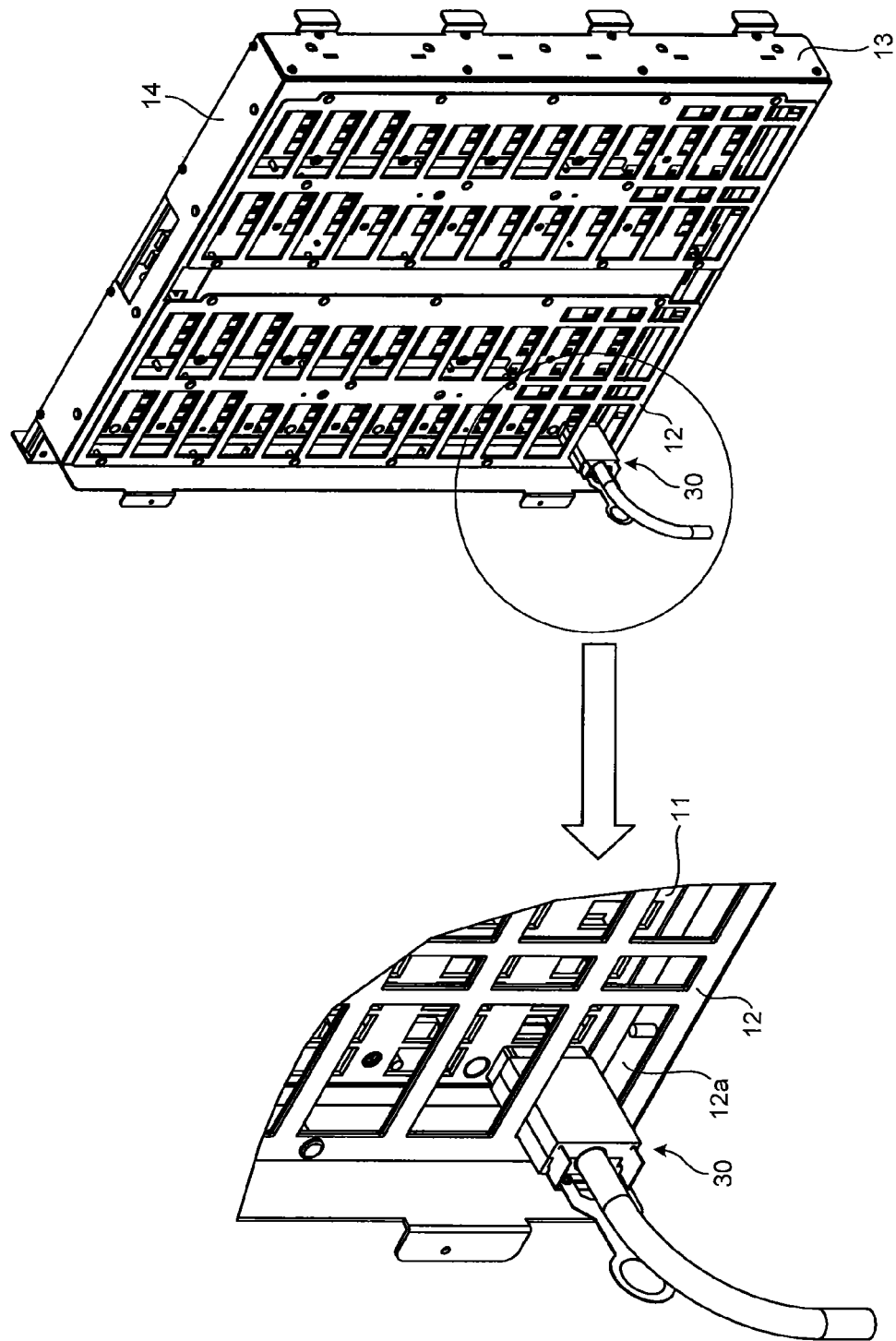

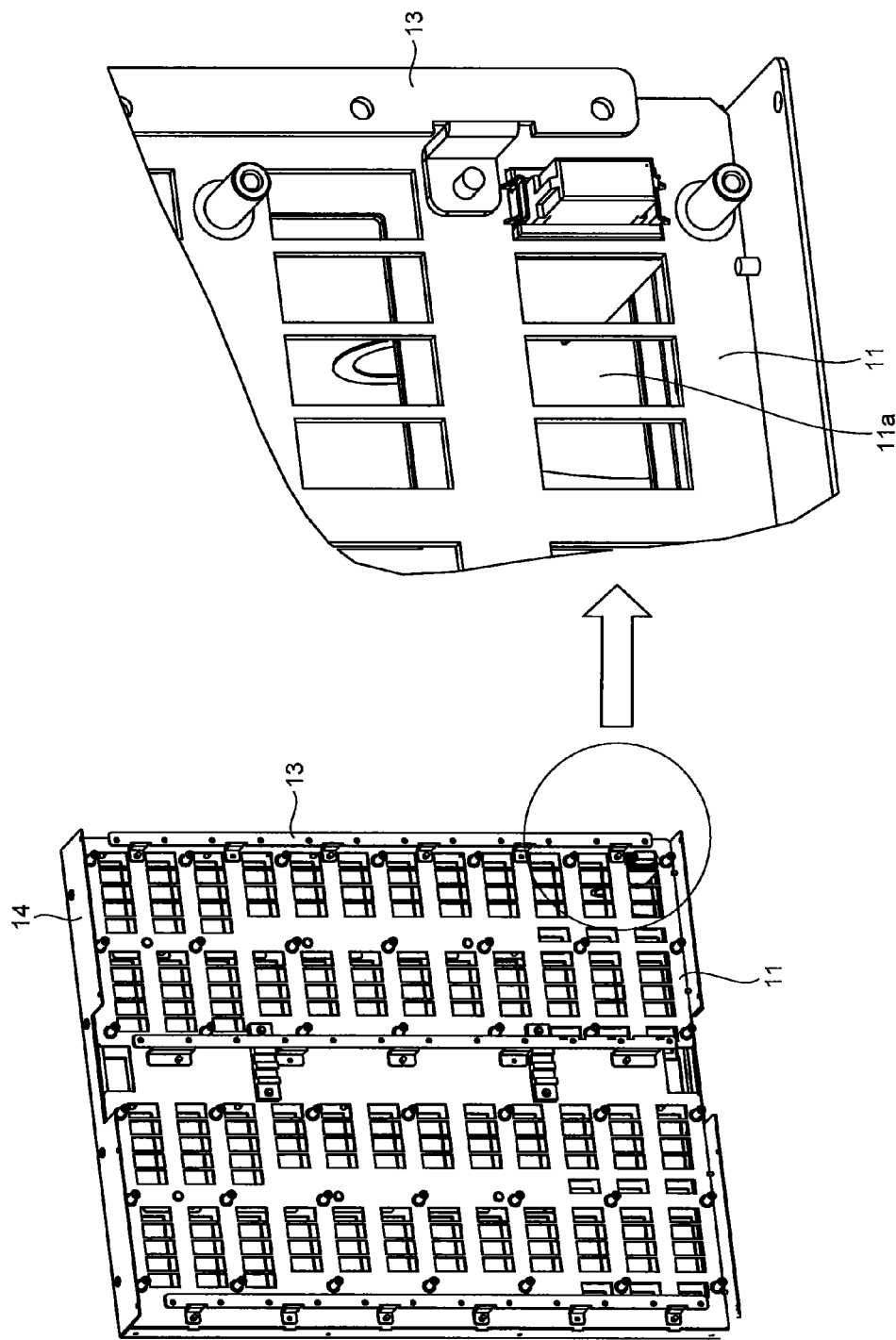

FIG.10
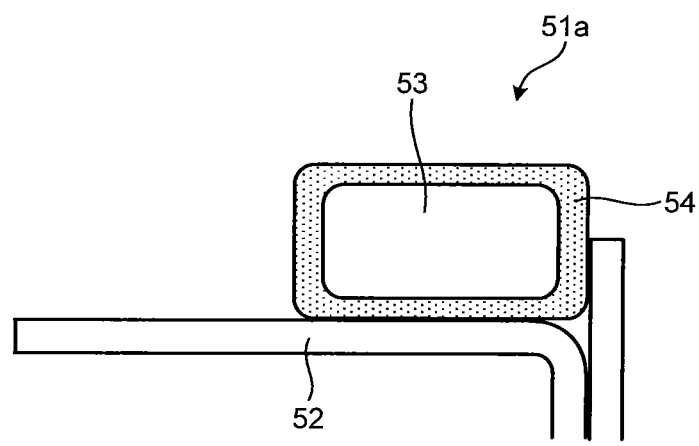
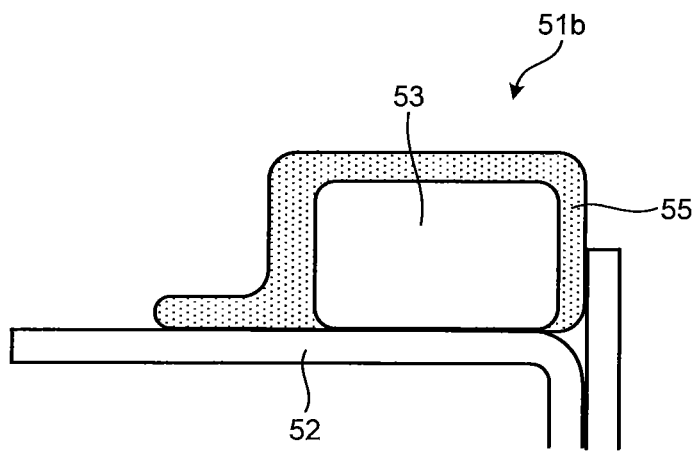

METAL SHEET STRUCTURE AND ELECTRONIC DEVICE

CROSS-REFERENCE TO RELATED APPLICATION

This application is a continuation of International Application No. PCT/JP2009/067934, filed on Oct. 16, 2009, the entire contents of which are incorporated herein by reference.

FIELD

The embodiments discussed herein are directed to a metal sheet structure and an electronic device.

BACKGROUND

For connecting sections that connect a circuit board and cable, there is a need for a countermeasure against the load applied to the connecting sections by the cable itself because, if the countermeasure against the cable load is insufficient, the cables or connectors may break or become detached.

When using a relatively small connector as a connecting section, because the connecting section does not endure a large cable load, the weight of the cable or the number of cables to be connected is limited. Accordingly, when a large cable is used for the connection, a large connector having a relatively complicated structure is used and screwed into the connector section in order to endure the cable load.

FIG. 11 is a schematic diagram illustrating an example of a conventional cable connector. A cable 60 illustrated in FIG. 11 has cable connectors 61 at both ends of the cable 60. Each of the cable connectors 61 has a terminal section 63, a connector case 62, and a pair of screw sections 64.

Each of the cable connectors 61 is fitted to a connector receiving section 65 that is arranged on a circuit board side, is screwed into the screw sections 64, and is fixed therein. In this way, the cable connectors 61 each have the connector case 62, which is large with respect to the terminal section 63, and is screwed at both ends of the connector case 62, by which the load applied to the cable is born.

These related-art examples are described, for example, in Japanese Laid-open Patent Publication No. 59-037000 and Japanese Laid-open Patent Publication No. 2000-223213.

However, as in the conventional technology, if the size of the connector section is large, space larger than that needed for signal transmission is used for the countermeasure against the load.

In recent years, due to high-density assembly, a large number of cables are connected to a circuit board and a housing. However, with the conventional technology, if a countermeasure is taken against the cable load by increasing the size of the connector section, it is not possible to increase the packaging density of the connector. In contrast, when increasing the packaging density of the connector, the size of the connector section is inevitably reduced. Accordingly, there is a problem in that it is not possible to handle the cable load and, if a lot of cables are connected, it is hard to endure the cable load.

SUMMARY

According to an aspect of an embodiment of the invention, a metal sheet structure includes a printed circuit board that includes a second connector that fits into a first connector for a cable, a first metal sheet that is provided with a first surface arranged opposite the printed circuit board and that is provided with a first hole section that holds the first connector that passes through the first hole section, and a second metal sheet that is provided with a second surface arranged opposite the first metal sheet and is provided with a second hole section that holds the first connector that passes through the second hole section.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

BRIEF DESCRIPTION OF DRAWINGS

FIG. 3 is a perspective view of the metal sheet structure illustrated in FIG. 1, viewed from the connector side;

FIG. 4 is a perspective view of the metal sheet structure illustrated in FIG. 1, viewed from a printed circuit board 10 side;

FIG. 10 is a sectional view illustrating a specific example of a gasket 51; and

DESCRIPTION OF EMBODIMENTS

Preferred embodiments of the present invention will be explained with reference to accompanying drawings. However, the embodiment is not intended to restrict the disclosed technology.

First Embodiment

Figure 1:
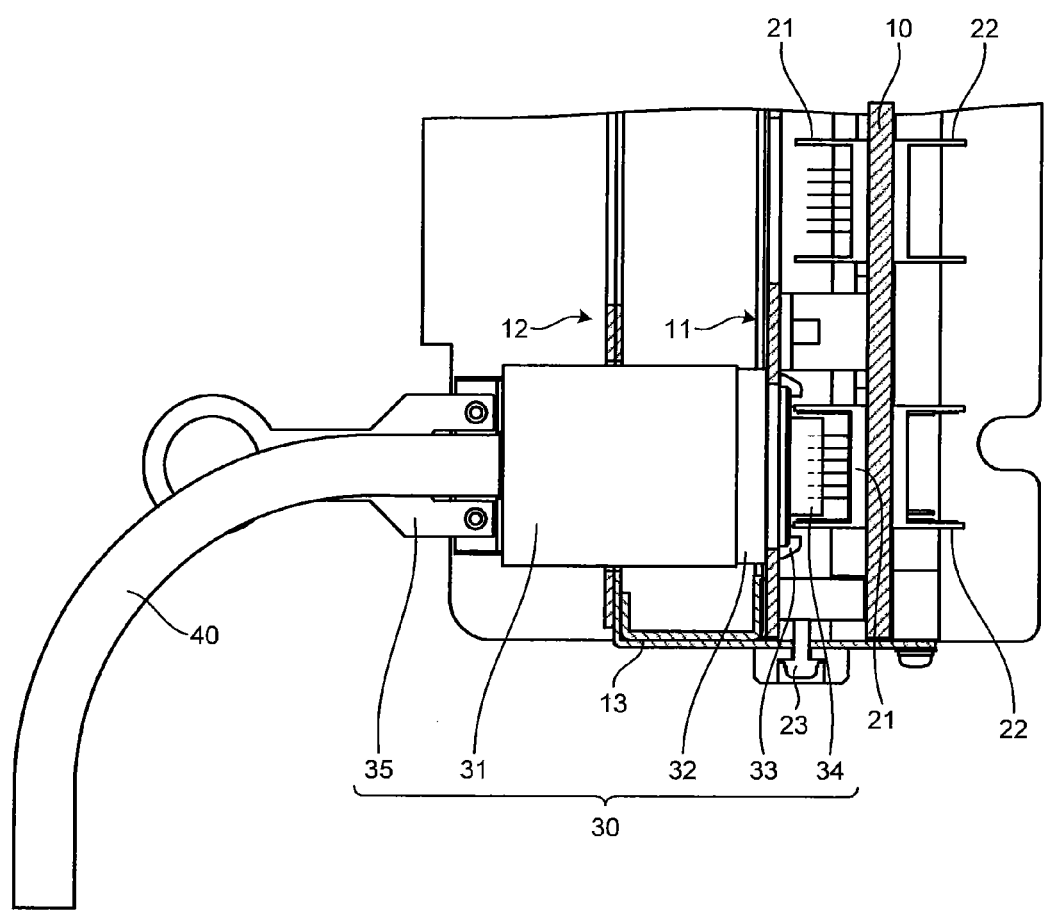
FIG. 1 is a sectional view illustrating a metal sheet structure according to a first embodiment of the present invention.

FIG. 1 is a sectional view illustrating a metal sheet structure according to a first embodiment of the present invention. The metal sheet structure illustrated in FIG. 1 can be used as a cable connecting section of any electronic device. An example of an electronic device that uses the metal sheet structure illustrated in FIG. 1 includes a server device that is used as an information processing apparatus.

Figure 2A:
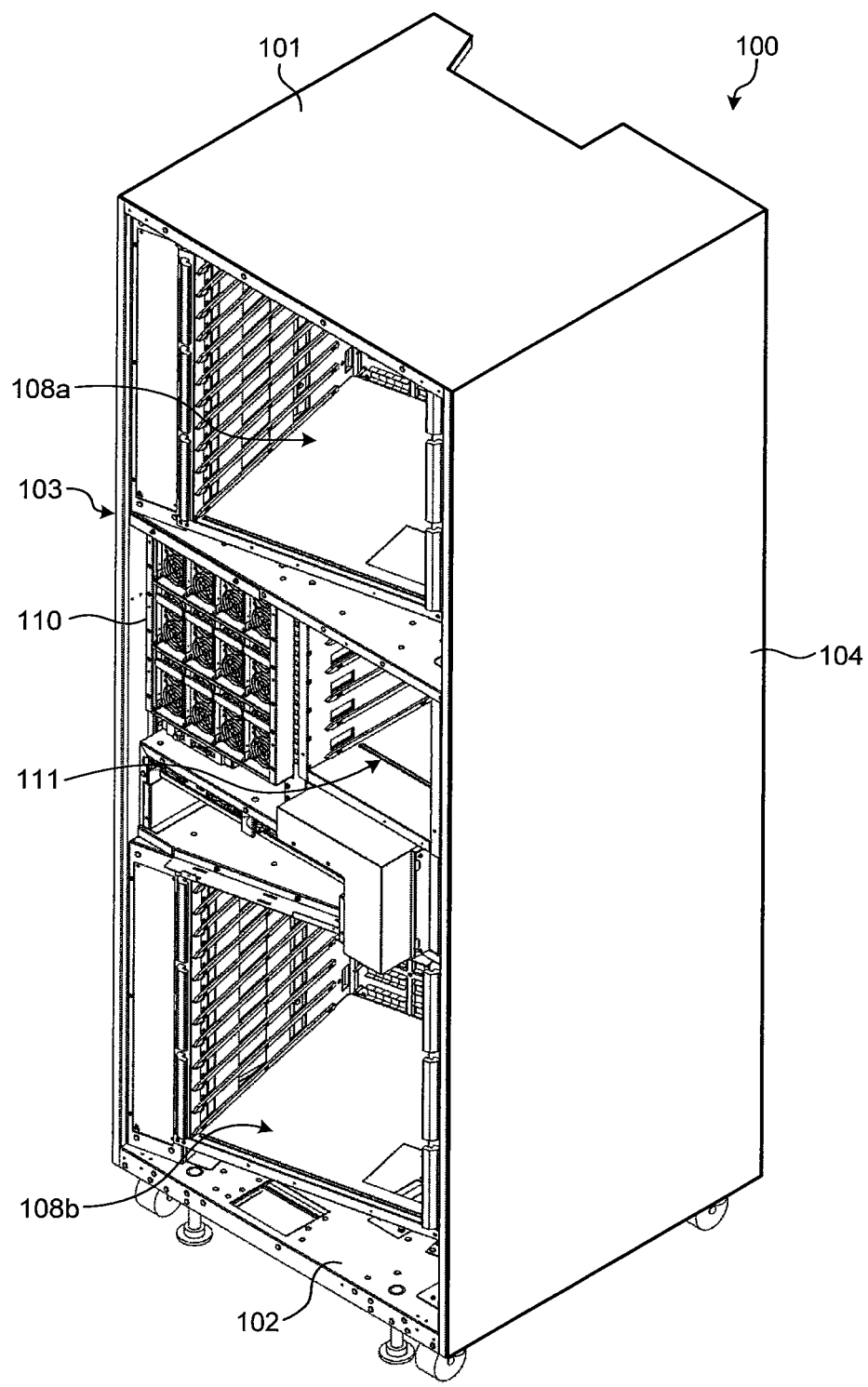
FIG. 2A is a perspective view, from the front, of a server device that uses the metal sheet structure illustrated in FIG. 1.
Figure 2B:
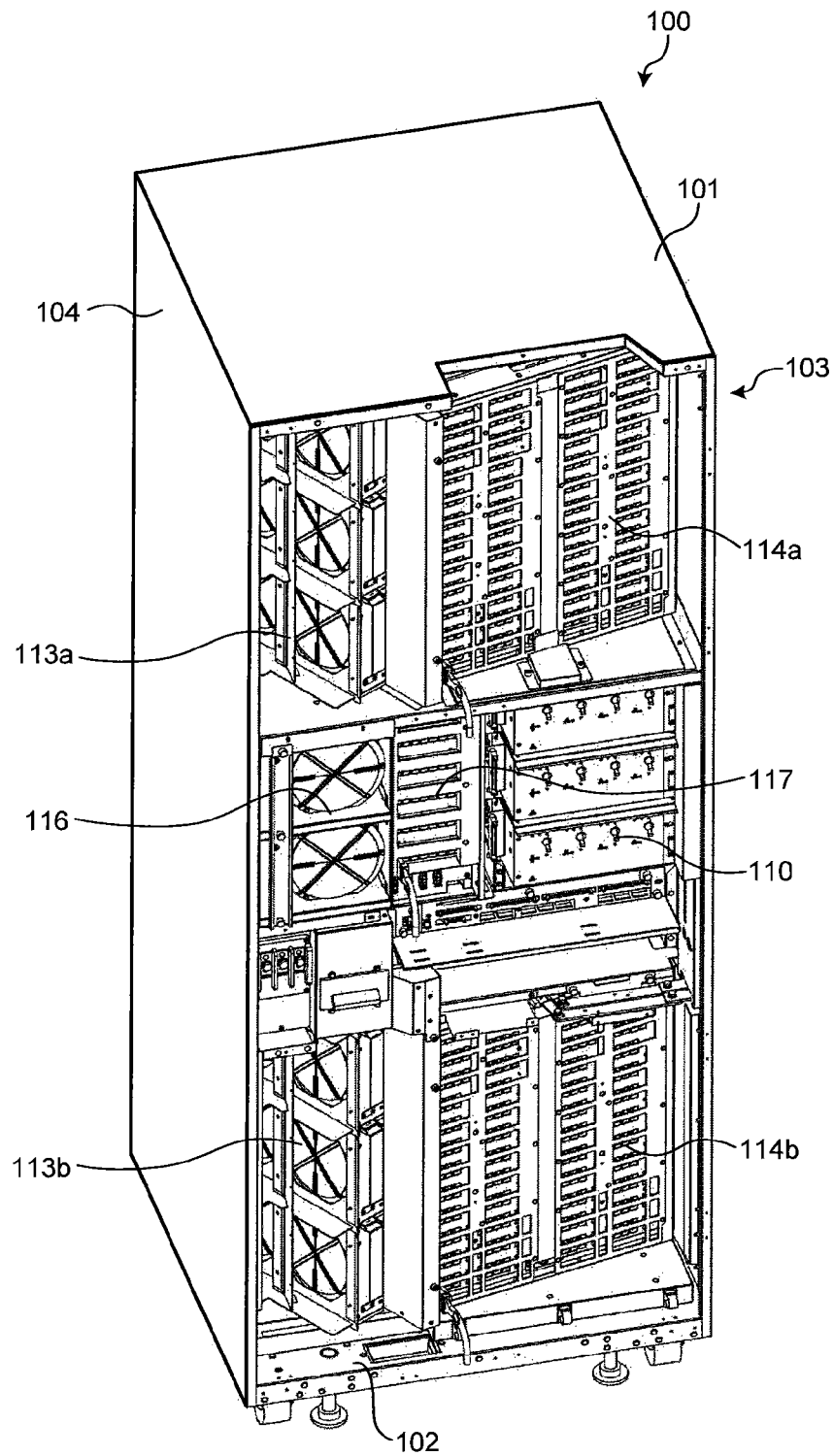
FIG. 2B is a perspective view, from the back, of the server device that uses the metal sheet structure illustrated in FIG. 1.

FIG. 2A is a perspective view, from the front, of a server device that uses the metal sheet structure illustrated in FIG. 1. FIG. 2B is a perspective view, from the back, of the server device that uses the metal sheet structure illustrated in FIG. 1. As illustrated in FIGS. 2A and 2B, a server device 100 is substantially cuboidal in shape and includes a top plate 101, side plates 103 and 104, and a base plate 102. A front plate and a back plate are not illustrated in FIGS. 2A and 2B.

The server device 100 includes a shelf 108a and a shelf 108b in a space formed by the side plates 103 and 104. A printed circuit board that is used as a system board is arranged on each of the shelves 108a and 108b.

Furthermore, the server device 100 includes a power supply unit 110 and a shelf 111 arranged between the shelves 108a and 108b.

The power supply unit 110 controls the power supply supplied to each of the printed circuit board mounted on the server device 100. A printed circuit board functioning as a connection interface that transmits and receives data between an external unit and the electronic device, such as a network card, is arranged on the shelf 111.

As illustrated in FIG. 2B, the server device 100 includes a cooling device 113a and a back plane 114a on a back surface of the shelf 108a. The cooling device 113a cools a plurality of system boards arranged on the shelf 108a. The back plane 114a is a printed circuit board that electrically connects the system boards arranged on the shelf 108a. Connecting terminals arranged on the back surfaces of the system boards are connected to the back plane 114a, which functions as a connecting circuit board, and thereby the system boards are electrically connected.

Similarly, the server device 100 includes a cooling device 113b and a back plane 114b on a back surface of the shelf 108b. The cooling device 113b cools a plurality of system boards arranged on the shelf 108b. The back plane 114b is a printed circuit board that electrically connects the system boards arranged on the shelf 108b. Connecting terminals arranged on the back surface of the system boards are connected to the back plane 114b, which functions as a connecting circuit board, and thereby the system boards are electrically connected.

Furthermore, the server device 100 includes a cooling device 116 and a back plane 117 on the back surface of the shelf 111. The cooling device 116 cools a plurality of interface boards arranged on the shelf 111. The back plane 117 connects the interface boards arranged on the shelf 111.

Figure 5:
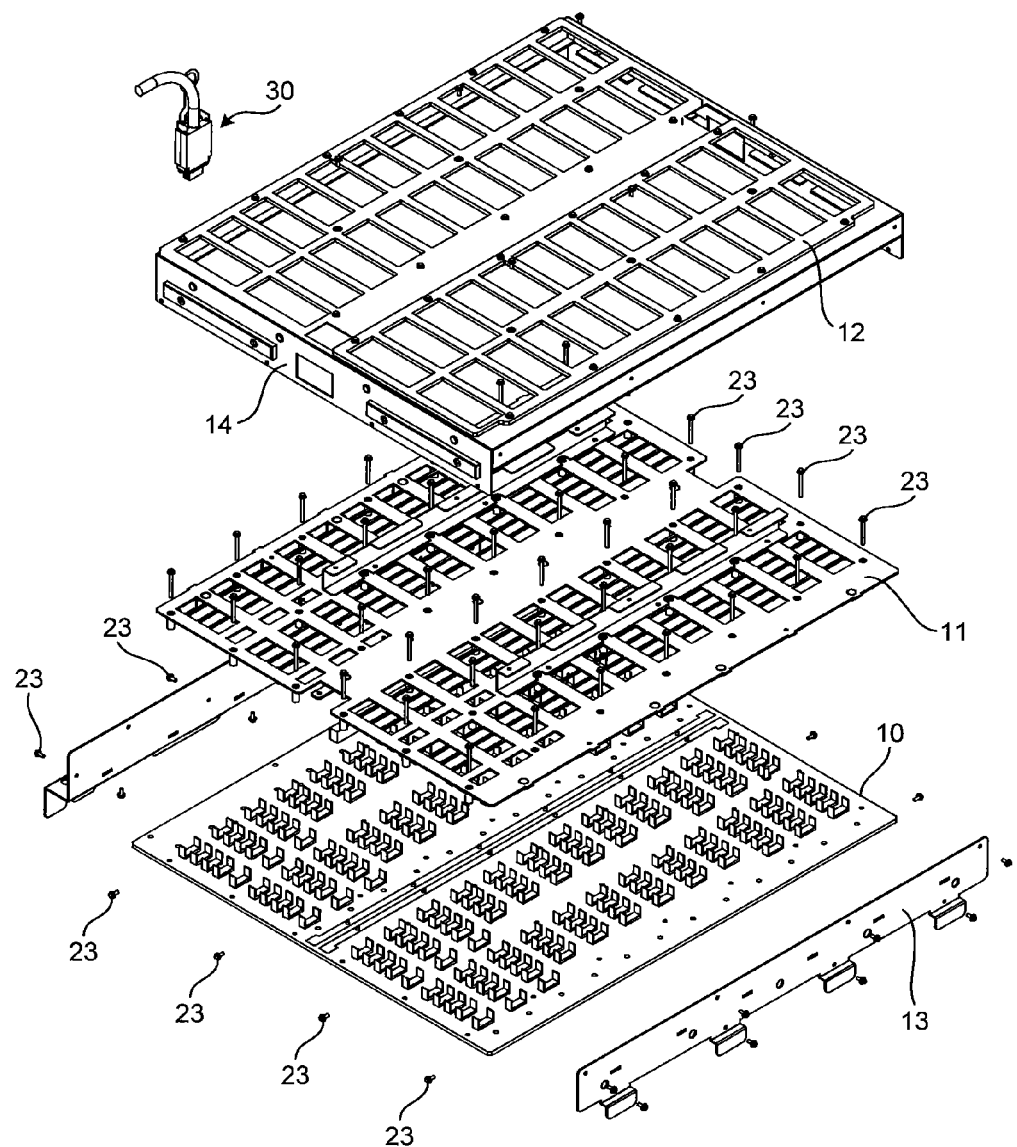
FIG. 5 is an exploded view of the metal sheet structure illustrated in FIG. 1.

The metal sheet structure illustrated in FIG. 1 is arranged on the back plate side of the housing of the server device and functions as a cable connecting section of a cable that is connected to a system board or an interface board. The printed circuit board 10 illustrated in FIG. 1 is a printed circuit board that functions as the back plane illustrated in FIGS. 2A and 2B. FIG. 3 is a perspective view of the metal sheet structure illustrated in FIG. 1, viewed from the connector side. FIG. 4 is a perspective view of the metal sheet structure illustrated in FIG. 1, viewed from the printed circuit board 10 side. FIG. 5 is an exploded view of the metal sheet structure illustrated in FIG. 1.

As illustrated in FIG. 1, the printed circuit board 10 includes a connector 21, functioning as a second connector, that fits into a connector 30 for a cable 40, i.e., a first connector for the cable. Furthermore, the printed circuit board 10 includes a connector 22 that is used to connect another printed circuit board.

Furthermore, the metal sheet structure illustrated in FIG. 1 includes a metal sheet 11, functioning as a first metal sheet, that is provided with a first surface arranged opposite the printed circuit board 10 and that is provided with a first hole section that holds the connector 30 passing through the first hole section.

The first hole section is illustrated in FIG. 4 as a hole section 11a. As illustrated in FIG. 4, the hole section 11a has a shape enclosing the cross section of the connector 30 with respect to a plane formed by the metal sheet 11.

Furthermore, the metal sheet structure illustrated in FIG. 1 also includes a metal sheet 12, functioning as a second metal sheet, that is arranged opposite a second surface of the metal sheet 11, i.e., a surface on the opposite side from the printed circuit board 10, and that is provided with a second hole section that holds the connector 30 passing through the second hole section.

The second hole section is illustrated in FIG. 3 as a hole section 12a. The printed circuit board 10 includes a plurality of connectors 21, each of which can fit into the connector 30 for the cable 40. As illustrated in FIG. 3, the hole section 12a has a shape enclosing the cross section of the connector 30 with respect to a plane formed by the metal sheet 12.

Furthermore, a metal sheet 13 illustrated in FIG. 1 is a third metal sheet that holds a first side surface of the metal sheet 11 and a first side surface of the metal sheet 12 and that electrically connects the metal sheet 11 and the metal sheet 12 to the printed circuit board. A metal sheet 14 illustrated in FIGS. 3, 4, and 5 is a fourth metal sheet that holds a second side surface of the metal sheet 11 and a second side surface of the metal sheet 12 and that electrically connects the metal sheet 11 and the metal sheet 12 to the printed circuit board 10. The metal sheets 13 and 14 are fixed with a screw 23 to the printed circuit board 10.

By electrically connecting the metal sheets 11 and 12 to the printed circuit board 10, the metal sheets 11 and 12 have the same electric potential as that of the printed circuit board 10. Because the printed circuit board 10 is grounded by being connected to a ground potential, both of the metal sheets 11 and 12 are grounded by being connected to the ground potential via the printed circuit board 10.

The connector 30 illustrated in FIG. 1 is arranged at one end of the cable 40 and has a substantially cuboidal shape. The connector 30 includes a connector case 31, a shield member 32, locking sections 33, a terminal section 34, and an unlocking section 35.

When connecting the cable 40 to the printed circuit board 10, if the connector case 31 is inserted into the hole section 12a of the metal sheet 12 and is pushed into the connector 21 arranged on the circuit board side, the leading edge of the locking section 33 fits inside the metal sheet 11, i.e., fits into the printed circuit board 10 side.

If the terminal section 34 is plugged into the connector 21 and reaches a predetermined connecting location, the metal sheet 11 is inserted into steps of the locking section 33 and then the connection of the connector is fixed. At this time, the shield member 32 makes contact with the metal sheet 11, thus covering the hole section 11a.

Furthermore, the metal sheet 12 supports the connector case 31 from below to reduce the load of the cable 40 exerted on the connector 21, the terminal section 34, and the locking section 33.

Because the metal sheet 11 and the metal sheet 12 support the connector 30 in this way, the metal sheet structure has a structure in which the load of the cable 40 is not directly exerted on the connector 21. Accordingly, it is possible to prevent the cable 40 or the connector 30 from breaking or becoming detached.

From the viewpoint of supporting the load of the connector 30, the distance from the metal sheet 11 to the metal sheet 12 is preferably equal to or greater than the length of the connector case 31, i.e., half of the depth of the connector 30. In contrast, when taking into consideration the operability of insertion and detachment of the connector 30, a part of the connector case 31 preferably protrudes outward from the metal sheet 12 when in the state in which the connector 30 is inserted. Specifically, the distance from the metal sheet 11 to the metal sheet 12 is preferably, for example, about ½ to ¾ of the length of the connector case 31.

Furthermore, because the metal sheet 11 and the metal sheet 12 are electrically grounded, they function as an electromagnetic wave shielding.

In general, when connecting a cable to a circuit board, in addition to handling the cable load, shielding from electromagnetic waves is a problem. If the electromagnetic wave shielding is inadequate, noise generated by the device may possibly affect another device or the device may possibly erroneously operates due to noise from outside.

When using a small connector having a relatively simple structure, it is usually difficult to perform electromagnetic wave shielding on the connecting section; therefore, the entire circuit board or the cable is covered by an electromagnetic wave shielding member. Furthermore, when a cable that connects devices is used, the entire section is not covered; therefore, a large connector having a relatively complicated structure is used for the electromagnetic wave shielding function.

However, with the metal sheet structure according to the first embodiment, because the metal sheet 11 and the metal sheet 12 each function as an electromagnetic wave shielding member, electromagnetic wave shielding is possible for the entire surface located directly above the connector 21. Accordingly, a high shielding effect can be obtained without using a large connector.

Figure 6:
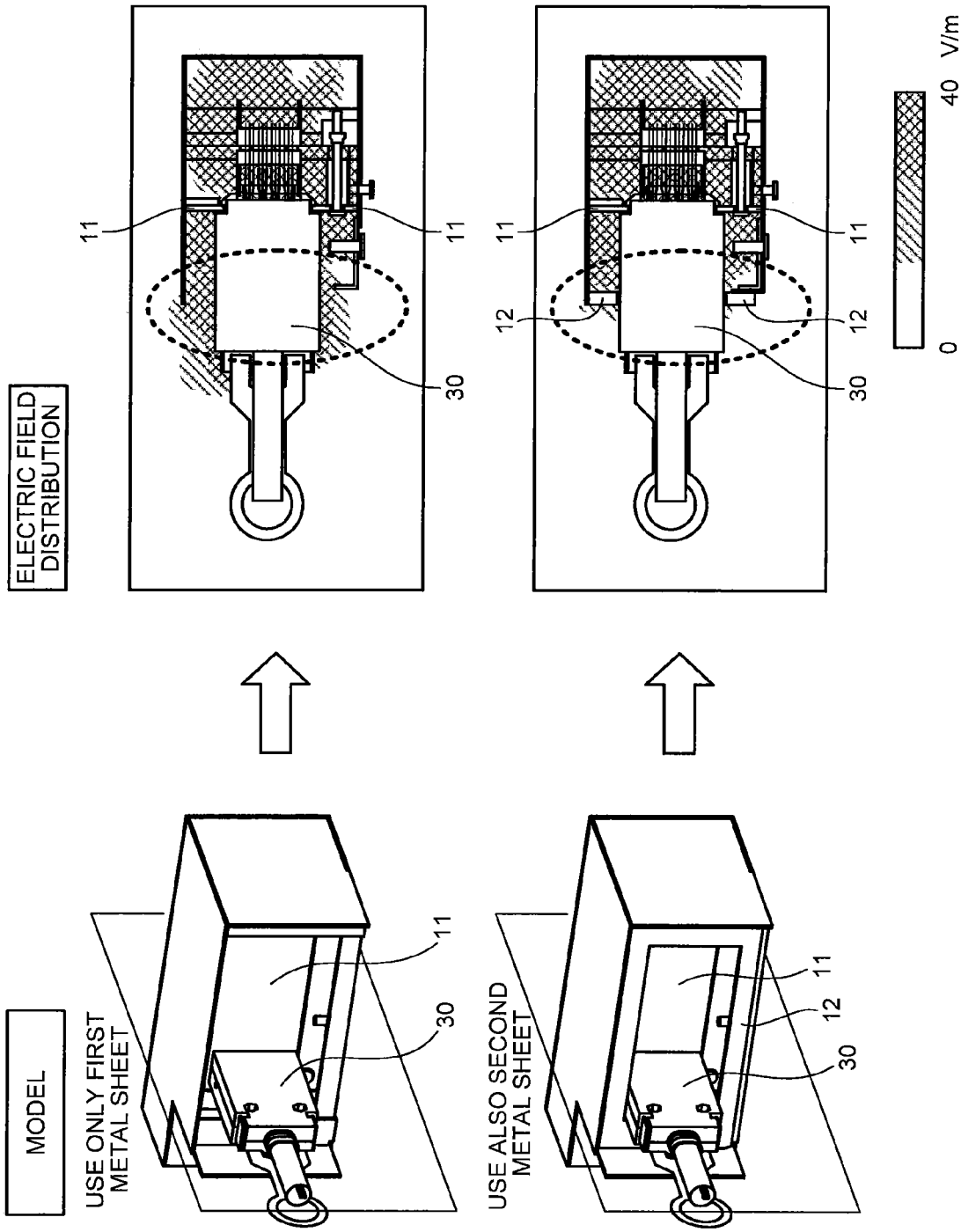
FIG. 6 is a schematic diagram illustrating an electromagnetic wave shielding effect due to a metal sheet 11 and a metal sheet 12.

FIG. 6 is a schematic diagram illustrating the electromagnetic wave shielding effect due to the metal sheet 11 and the metal sheet 12. The electric field distribution illustrated in FIG. 6 is obtained by measuring distribution of an electric field of 5.6 GHz. The leakage of the electromagnetic waves into the surroundings of the connector 30 is suppressed by the metal sheet 11. Specifically, most of the electromagnetic waves of about 40 V/m are trapped in the metal sheet 11.

In the result of the measurement performed only on the metal sheet 11, the leakage of electromagnetic waves can be observed at a location outside the metal sheet 12. However, by additionally using the metal sheet 12, it is possible to enhance the electromagnetic wave shielding effect and to prevent electromagnetic waves from leaking outside the metal sheet 12. In this analysis case, by additionally using the metal sheet 12, it is possible to enhance the electromagnetic wave shielding effect by about 4 dB.

As described above, the shield member 32 of the connector 30 makes contact with the metal sheet 11 to cover the hole section 11a. By covering the hole section 11a in this way, the effect of the electromagnetic wave shielding is enhanced. Furthermore, if a cable or a connector breaks or becomes detached, the leakage of electromagnetic waves occurs from the section where the breakage or detachment occurs. Accordingly, the prevention of the breakage or detachment of the metal sheet 12 is also effective in enhancing the reliability of the electromagnetic wave shielding.

In the following, the unlocking section 35 will be described. When unplugging the cable 40 from the printed circuit board 10, by pulling the unlocking section 35, the locking section 33 is pushed inside and the lock is released, thereby the cable is unplugged.

Figure 7:
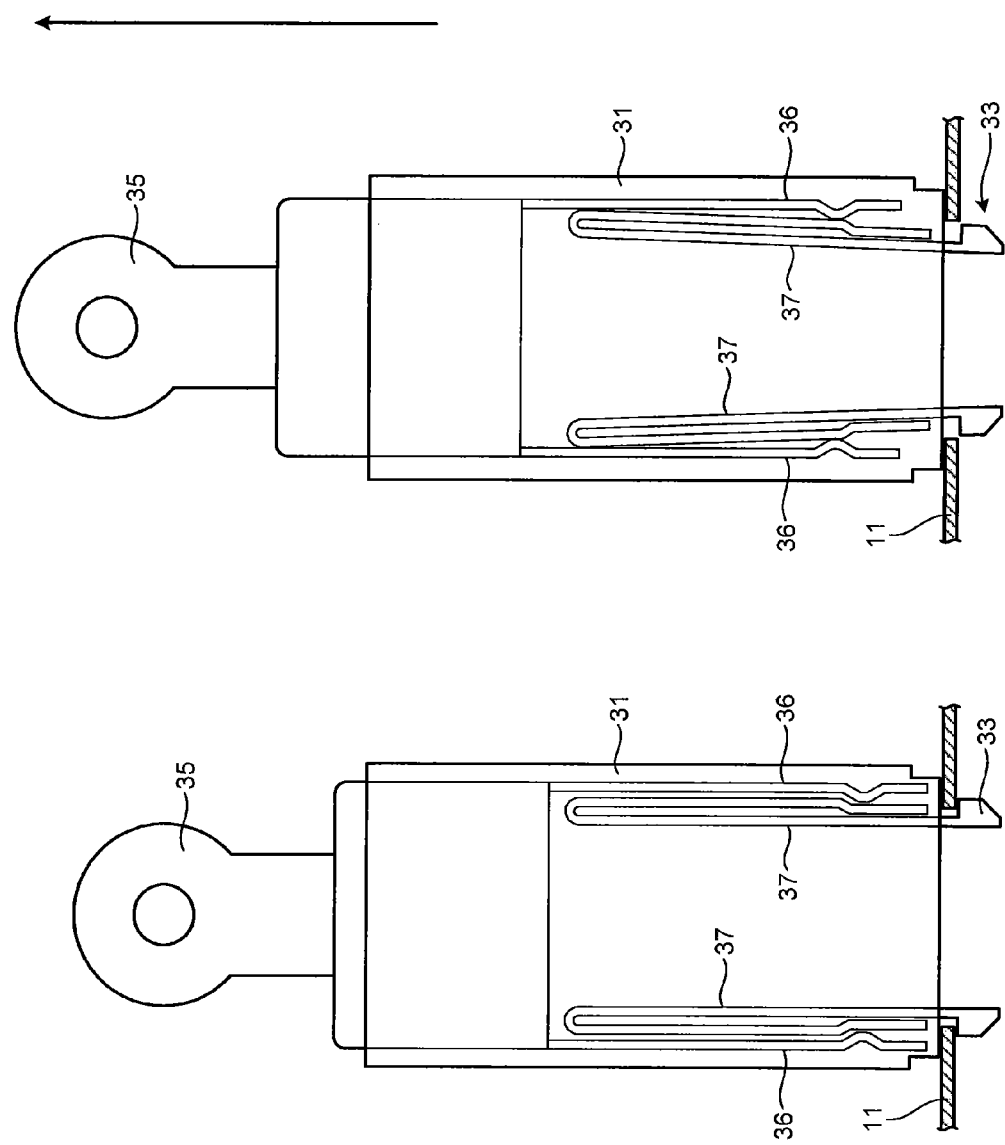
FIG. 7 is a schematic diagram illustrating an example of the structure of locking sections 33 and unlocking sections 35.

FIG. 7 is a schematic diagram illustrating an example of the structure of the locking sections 33 and the unlocking sections 35. In the example structure illustrated in FIG. 7, each of the unlocking sections 35 includes plate-shaped members 36 inside the connector case 31. Each of the plate-shaped members 36 includes a protruding section protruding toward the inside of the connector case 31. Furthermore, each of the locking sections 33 includes, in the connector case 31, a plate-shaped member 37 having steps. The steps of the plate-shaped member 37 are arranged in the external direction in the connector case 31. The thickness of the steps becomes smaller as the steps are arranged closer to the terminal section 34, whereas thickness of the steps becomes larger as the steps are arranged further away from the terminal section 34.

In the state in which the unlocking section 35 is pushed into the connector case 31, protruding sections of the plate-shaped members 36 are located on the lower side of the plate-shaped members 37, thereby claws of the locking sections 33 can catch the metal sheet 11.

In contrast, in the state in which the unlocking section 35 is released, the protruding sections of the plate-shaped members 36 are located on the higher side of the plate-shaped member 37. Accordingly the protruding sections of the plate-shaped members 36 are in the state in which the protruding sections inwardly press the plate-shaped members 37, thereby the claws of the locking sections 33 move in the inside direction of the connector case 31. Therefore, because the claws of the locking sections 33 do not catch the metal sheet 11, the connector 30 can be pulled out.

As described above, with the metal sheet structure and the electronic device described in the first embodiment of the present invention, the metal sheet 11 functioning as the first metal sheet is arranged directly above the printed circuit board 10, the connector 30 is fixed, and then the electromagnetic wave shielding is performed. Furthermore, when the connector 30 on the cable 40 side fits into the connector 21 of the printed circuit board 10 to connect to the printed circuit board 10, the claw-shaped locking sections 33 catch the metal sheet 11.

Furthermore, with the metal sheet structure and the electronic device described in the first embodiment of the present invention, the shield member 32 arranged in the connector 30 on the cable 40 side makes contact with the metal sheet 11 to fill the gap therebetween, thus the electromagnetic wave shielding characteristics are improved. Furthermore, with the metal sheet structure and the electronic device described in the first embodiment of the present invention, because the metal sheet 12 functioning as the second metal sheet is arranged away from the metal sheet 11 by a predetermined distance, the connector 30 is supported by the metal sheet 12 and the effect of the electromagnetic wave shielding is thus improved.

Accordingly, with the metal sheet structure and the electronic device described in the first embodiment of the present invention, there is no need to use a screw to support the cable load, and there is no need for the space for a screw itself and for the working space for attaching or detaching the screw.

With the metal sheet structure and the electronic device described in the first embodiment of the present invention, by supporting the connector at two separated points, the cable load is not applied to the connector, thus the reliability of the connector connection is improved. Accordingly, a small connector can provide electromagnetic wave shielding and support the cable load, thus it is possible to arrange a large number of cables used for connecting between a circuit board and a device.

Furthermore, with the metal sheet structure and the electronic device described in the first embodiment of the present invention, the electromagnetic wave shielding characteristics are ensured by using the first metal sheet. Then, with the metal sheet structure and the electronic device described in the first embodiment of the present invention, by additionally using the second metal sheet, the shielding characteristics are further improved.

Second Embodiment

Figure 8:
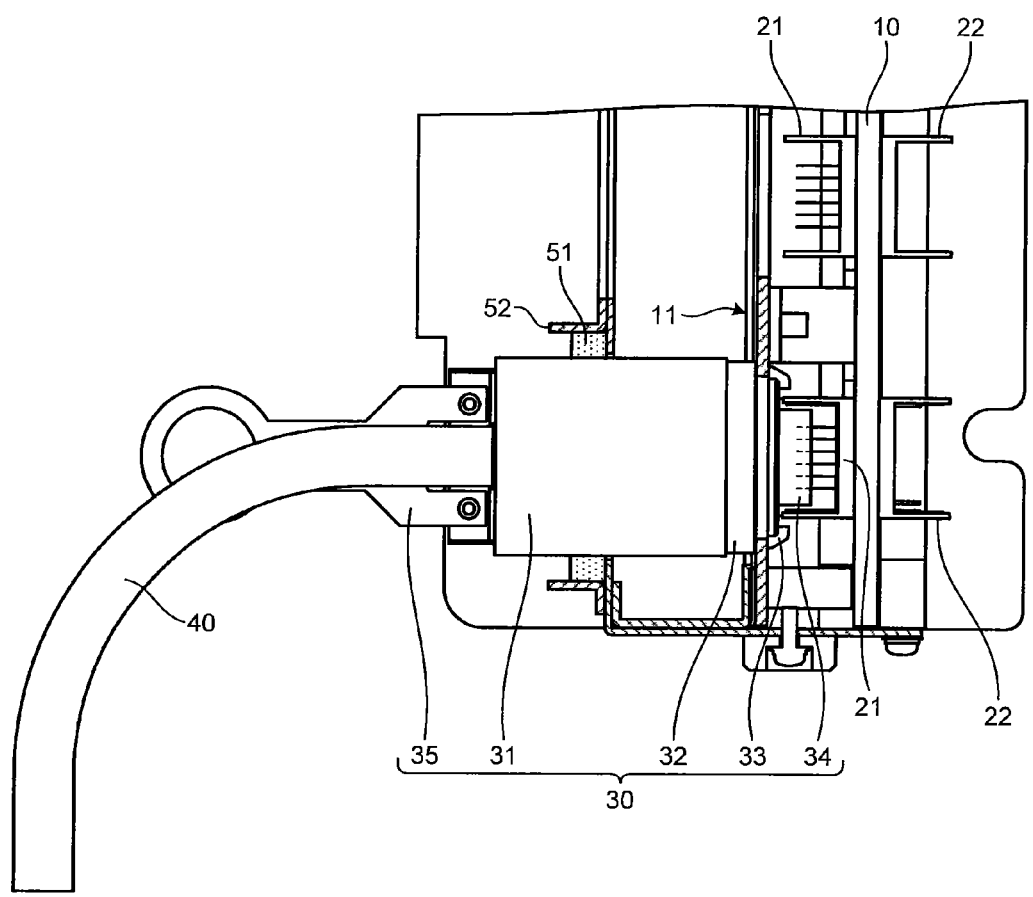
FIG. 8 is a sectional view of a metal sheet structure according to a second embodiment.

FIG. 8 is a sectional view of a metal sheet structure according to a second embodiment. A metal sheet structure illustrated in FIG. 8 differs from that according to the first embodiment in that a shield member is arranged in the hole section of the second metal sheet. Because the configuration of the other components are the same as those in the first embodiment, components that are the same as those in the first embodiment are assigned the same reference numerals, and therefore a description thereof is omitted.

Figure 9:
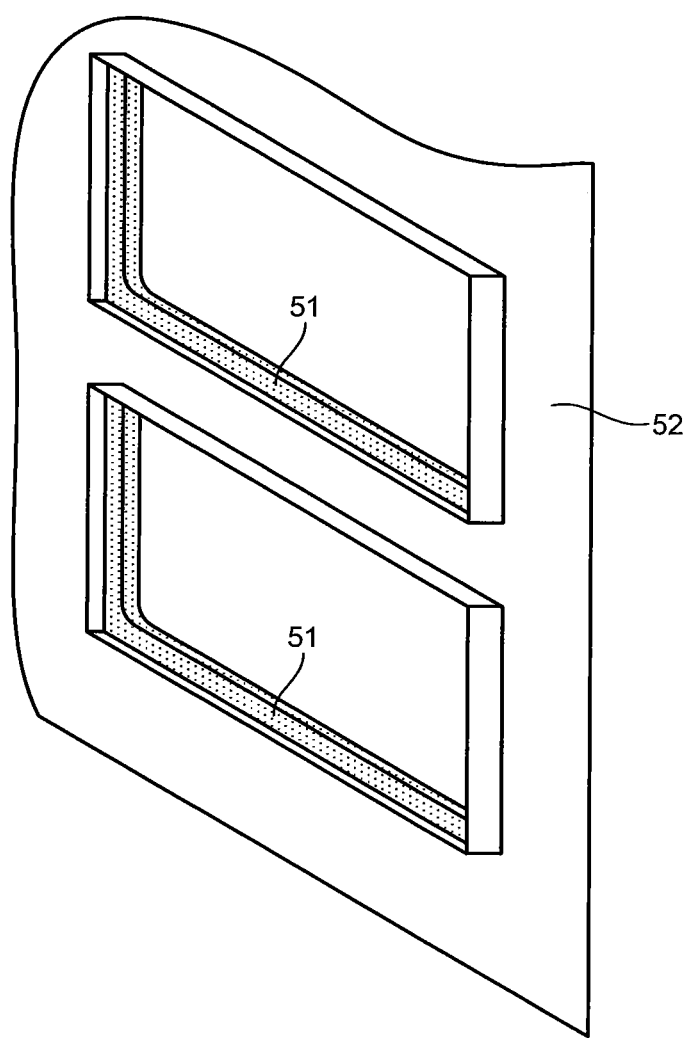
FIG. 9 is a perspective view of a metal sheet 52.
Figure 11:
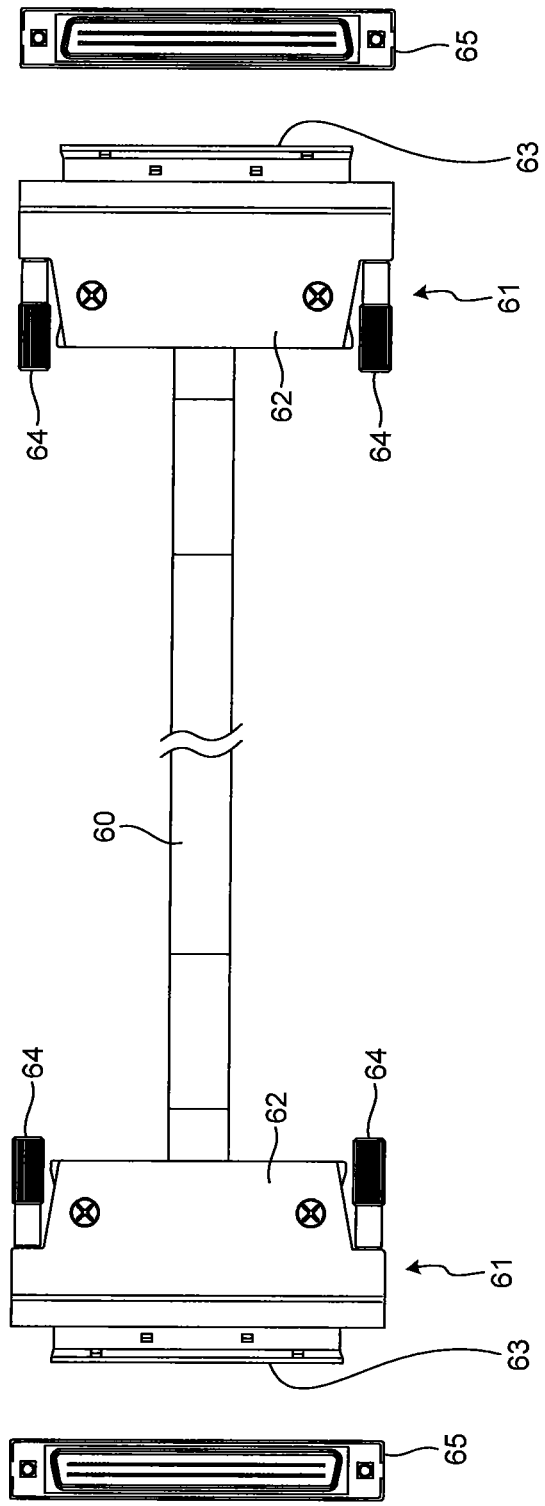
FIG. 11 is a schematic diagram illustrating a conventional cable connector.

With the metal sheet structure illustrated in FIG. 8, a metal sheet 52 functioning as the second metal sheet is bent, around the hole section, to face the side opposite to the metal sheet 11 functioning as the first metal sheet. The second metal sheet 52 includes a gasket 51 functioning as a shield member on the inner side of the hole section. Examples of the gasket include a conductive member in a plate spring shape. FIG. 9 is a perspective view of the metal sheet 52.

As illustrated in FIGS. 8 and 9, by arranging the gasket 51 in the gap between the metal sheet 52 and the connector 30, the electromagnetic wave shielding characteristics can be enhanced. Furthermore, because the gap between the metal sheet 52 and the connector 30 is eliminated, it is possible to enhance the force transmission prevention function with respect to the locking section 33, the terminal section 34, and the connector 21.

FIG. 10 is a sectional view illustrating a specific example of the gasket 51. With a gasket 51a illustrated in FIG. 10, a surface section 54 exhibiting conductivity is formed on the surface of a structural member 53 having the elastic or plastic characteristic. By arranging the gasket 51a on the inner side of the hole section of the metal sheet 52, the gasket 51a functions as a shield member that prevents the leakage of the electromagnetic wave. In contrast, with a gasket 51b illustrated in FIG. 10, after the structural member 53 is arranged on the inner side of the hole section of the metal sheet 52, a conductive film 55 is formed thereon. Similarly to the gasket 51a, the gasket 51b functions as a shield member that prevents the leakage of electromagnetic waves. An urethane resin can be used for the structural member 53, whereas a given metal can be used for the surface section 54 or the conductive film 55.

As described above, with the metal sheet structure described in the second embodiment of the present invention, by arranging the gasket 51 on the inner side of the hole section of the metal sheet 52 functioning as the second metal sheet, it is possible to enhance the electromagnetic wave shielding characteristics and support the connector 30 in a stable manner. The metal sheet structure described in the second embodiment of the present invention can, of course, be used with any electronic device.

One aspect of a metal sheet structure and an electronic device disclosed in the present application has an effect of providing a metal sheet structure and an electronic device in which the load-bearing capacity with respect to the cable connection is enhanced.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A metal sheet structure comprising:
    a printed circuit board that includes a second connector that fits into a first connector for a cable;
    a first metal sheet that is provided with a first surface arranged opposite a connecting surface of the second connector on the printed circuit board and that is provided with a first hole section that holds the first connector that passes through the first hole section; and
    a second metal sheet that is arranged opposite a second surface of the first metal sheet and is provided with a second hole section that holds the first connector that passes through the second hole section,
    Wherein a distance between the first metal sheet and the second metal sheet is greater than half of the depth of the first connector.

2. The metal sheet structure according to claim 1, wherein the first metal sheet and the second metal sheet are grounded by being connected to the ground potential of the printed circuit board.

3. The metal sheet structure according to claim 2, further comprising:
    a third metal sheet that holds a first side surface of the first metal sheet and a first side surface of the second metal sheet and that connects the first metal sheet and the second metal sheet to the ground potential of the printed circuit board; and
    a fourth metal sheet that holds a second side surface of the first metal sheet and a second side surface of the second metal sheet and that connects the first metal sheet and the second metal sheet to the ground potential of the printed circuit board.

4. The metal sheet structure according to claim 1, wherein the first hole section has a shape enclosing a cross section of the first connector with respect to a plane formed by the first metal sheet.

5. The metal sheet structure according to claim 1, wherein
    the printed circuit board includes multiple second connectors that fit into multiple first connectors of multiple cables, and
    the second hole section has a shape enclosing a cross section of the first connectors with respect to a plane formed by the second metal sheet.

6. The metal sheet structure according to claim 1, wherein the first connector has a substantially cuboidal shape.

7. The metal sheet structure according to claim 1, further comprising a gasket that is arranged in a gap between the second hole section and the first connector.

8. An electronic device comprising:
    a housing;
    a printed circuit board that is arranged on any one of the surfaces of the housing and that includes a second connector that fits into a first connector for a cable;
    a first metal sheet that is provided with a first surface arranged opposite a connecting surface of the second connector on the printed circuit board and that is provided with a first hole section that holds the first connector that passes through the first hole section; and
    a second metal sheet that is arranged opposite a second surface of the first metal sheet and is provided with a second hole section that holds the first connector that passes through the second hole section,
    wherein a distance between the first metal sheet and the second metal sheet is greater than half of the depth of the first connector.

9. The electronic device according to claim 8, wherein the housing, the first metal sheet, and the second metal sheet are grounded by being connected to the ground potential of the printed circuit board.

10. The electronic device according to claim 9, wherein further comprising:
a third metal sheet that is fastened to the housing, that holds a first side surface of the first metal sheet and a first side surface of the second metal sheet, and that connects the first metal sheet and the second metal sheet to the ground potential of the printed circuit board; and
a fourth metal sheet that is fastened to the housing, that holds a second side surface of the first metal sheet and a second side surface of the second metal sheet, and that connects the first metal sheet and the second metal sheet to the ground potential of the printed circuit board.

11. The electronic device according to claim 8, wherein the first hole section has a shape enclosing a cross section of the first connector with respect to a plane formed by the first metal sheet.

12. The electronic device according to claim 8, wherein the printed circuit board includes multiple second connectors that fit into multiple first connectors of multiple cables, and
the second hole section has a shape enclosing a cross section of the first connectors with respect to planes formed by the second metal sheet.

13. The electronic device according to claim 8, wherein the first connector has a substantially cuboidal shape.

14. The electronic device according to claim 8, further comprising a gasket that is arranged in a gap between the second hole section and the first connector.

* * * * *

UNITED STATES PATENT AND TRADEMARK OFFICE
CERTIFICATE OF CORRECTION

| | | |
|---|---|---|
| PATENT NO. | : 8,797,750 B2 | Page 1 of 1 |
| APPLICATION NO. | : 13/445456 | |
| DATED | : August 5, 2014 | |
| INVENTOR(S) | : Hidekia Maeda et al. | |

It is certified that error appears in the above-identified patent and that said Letters Patent is hereby corrected as shown below:

In the Claims

Column 8, Line 15 (Approx.) In Claim 1, delete "Wherein" and insert -- wherein --, therefor.

Signed and Sealed this
Eighteenth Day of November, 2014

Michelle K. Lee
*Deputy Director of the United States Patent and Trademark Office*